United States Patent [19]

Miyatake et al.

[11] Patent Number: 4,903,238
[45] Date of Patent: Feb. 20, 1990

[54] SEMICONDUCTOR MEMORY DEVICE WITH IMPROVED IMMUNITY TO SUPPLY VOLTAGE FLUCTUATIONS

[75] Inventors: Hideshi Miyatake; Masaki Kumanoya; Katsumi Dosaka, all of Hyogo, Japan

[73] Assignee: Mitsubishi Denki Kabushiki Kaisha, Tokyo, Japan

[21] Appl. No.: 201,787

[22] Filed: Jun. 2, 1988

[30] Foreign Application Priority Data

Jun. 4, 1987 [JP] Japan ............................ 62-140197

[51] Int. Cl.⁴ .................... G11C 7/00; G11C 11/40
[52] U.S. Cl. ........................... 365/189.06; 365/203; 365/190; 365/206
[58] Field of Search ............... 365/189, 203, 204, 205, 365/206, 149, 190, 226, 189.06, 189.11

[56] References Cited

U.S. PATENT DOCUMENTS

| | | | |
|---|---|---|---|
| 4,578,781 | 3/1986 | Ogana et al. | 365/205 X |
| 4,627,031 | 12/1986 | Van Tran | 365/203 X |
| 4,712,197 | 12/1987 | Sood | 365/203 X |
| 4,722,074 | 1/1988 | Fujishima et al. | 365/203 |
| 4,758,990 | 7/1988 | Uchida | 365/203 X |
| 4,780,850 | 10/1988 | Miyamoto et al. | 365/203 |
| 4,791,613 | 12/1988 | Hardee | 365/190 X |
| 4,791,616 | 12/1988 | Taguchi et al. | 365/203 X |
| 4,813,022 | 3/1989 | Matsui et al. | 365/203 |
| 4,829,483 | 5/1989 | Ogihara | 365/190 |

FOREIGN PATENT DOCUMENTS 59-5989 2/1984 Japan .
59-229788 12/1984 Japan .
53-140488 6/1988 Japan .................... 365/203

Primary Examiner—Stuart N. Hecker
Assistant Examiner—Alyssa H. Bowler
Attorney, Agent, or Firm—Lowe, Price, LeBlanc, Becker & Shur

[57] ABSTRACT

A semiconductor memory device such as a static RAM (Random Access Memory) device comprises a ground connection circuit of n channel field effect transistors connected between two I/O lines and the ground. The precharge circuit for precharging and the ground connection circuit both operate in response to the signal which is in synchronization with an externally applied external chip select signal. Therefore, the access delay derived from the fluctuation of the supply voltage generated before the change of the external chip select signal can be prevented.

17 Claims, 8 Drawing Sheets

SEMICONDUCTOR MEMORY DEVICE WITH IMPROVED IMMUNITY TO SUPPLY VOLTAGE FLUCTUATIONS

BACKGROUND OF THE INVENTION

1. Field of the Invention

The present invention relates to a semiconductor memory device and, more specifically, it relates to a semiconductor memory device which is capable of preventing access delay due to the fluctuation of the supply voltage.

2. Description of the Prior Art

FIG. 1 is a block diagram showing a conventional static RAM (Random Access Memory) as an example of a semiconductor memory device.

Referring to FIG. 1, the static RAM 21 comprises an I/O bus line 25 connected to the memory cell array 28 and an I/O bus control circuit 23 for controlling the I/O bus line 25. The I/O bus line 25 is connected so as to receive a column address signal Yi at the column decoder 26. A data input buffer 32 and a data output buffer 33 are also connected to the I/O bus line 25. An external chip select signal ext.$\overline{CS}$ which is the signal for externally controlling the state of the static RAM is applied to the clock generator 24 through a CS buffer 22. The clock generator 24 generates a clock signal $\phi$ in response to the signal ext.$\overline{CS}$. The I/O bus control circuit 23 controls the I/O bus line 25 in response to the clock signal $\phi$ from the clock generator 24. The description of other circuits shown in FIG. 1 will be omitted.

FIG. 2 is a schematic diagram showing in more detail the I/O bus line 25 and the I/O bus line control circuit 23 shown in FIG. 1. The I/O bus line 25 comprises two I/O lines 251 and 252, and n channel field effect transistors 31 to 3n and 41 to 4n for connecting the bit lines 281 to 28n of the memory array 28 with the I/O lines 251 and 252. Column address signals Y1 to Yn are respectively applied to the gate of each of the transistors. The I/O bus line control circuit 23 comprises n channel field effect transistors 1 and 2 constituting the load of the I/O lines 251 and 252, a p channel field effect transistor 5 for equalizing the I/O lines 251 and 252, and an equalizing signal generator 23 for generating the equalizing signal $\overline{IOEQ}$ in response to the clock signal $\phi$. Both transistors 1 and 2 have their respective gates and drains connected together to the power supply $V_{cc}$. The transistor 5 is connected between the two I/O lines 251 and 252 with the equalizing signal $\overline{IOEQ}$ applied to the gate thereof.

The provision of a load such as the transistors 1 and 2 of FIG. 2 between the I/O line and the power supply is known as the circuit technique required for implementing high speed operation of the semiconductor memory device. For example, similar circuit technique can be seen in the Japanese Patent Publication Gazette No. 5989/1984 and in the Japanese Patent Laying-Open Gazette No. 229788/1984. This technique has been recently applied to the dynamic RAM which is capable of static column mode.

FIGS. 3 and 4 are timing charts for describing the operation of the static RAM shown in FIG. 2. FIG. 3 shows the case in which the supply voltage has no fluctuation while FIG. 4 shows the case in which the supply voltage has fluctuation. $V_{cc}$ denotes the voltage level of the power supply $V_{cc}$ and $V_{ss}$ shows the voltage level of the ground, respectively.

The operation of the static RAM with no fluctuation of the supply voltage will be hereinafter described with reference to FIGS. 2 and 3.

First, the static RAM is in the standby state due to the application of high level external chip select signal ext.$\overline{CS}$. In the standby state, the I/O lines 251 and 252 are brought to the voltage of $V_{cc}-V_T$ by the transistors 1 and 2. $V_{cc}$ is the value of the power supply $V_{cc}$ and $V_T$ is the threshold voltage value of the transistors 1 and 2. The transistor 5 turns on in response to a low level equalizing signal $\overline{IOEQ}$ to bring the two I/O line 251 and 252 at the same voltage. When the signal ext.$\overline{CS}$ changes to the low level and the signal $\overline{IOEQ}$ changes to the high level, the signal stored in a certain memory cell (for example, MC1) of the memory array is applied to the I/O lines 251 and 252 through the bit line 281. The solid line and the dotted line in FIG. 3 show that the two I/O lines 251 and 252 are brought to the different voltages. On this occasion, since the transistors 1 and 2 serving as the I/O line load are connected to the I/O lines 251 and 252, the I/O lines to which a low level signal is applied are not fully brought to the ground $V_{ss}$ level. Although the voltage difference between the two I/O lines 251 and 252 is small, this is amplified by a highly sensitive current mirror type sense amplifier, so that the high speed operation of the static RAM is possible. In addition, the range of the voltage change of the I/O lines is narrowed down by the I/O line load, so that faster operation of equalization or precharge is possible. Meanwhile, the method of precharging the I/O line to the same level as the supply voltage $V_{cc}$ may be applied as an alternative; however, it is not preferred since the sensitivity of the current mirror type sense amplifier decreases due to the characteristics. In addition, since the transistors 31 and 41 operate in response to the column address signal Y1 having a high level signal of the voltage level, that is $V_{cc}$, for example, the high speed operation of the transistors 31 and 41 is prevented if the I/O lines 251 and 252 are brought to the same voltage level as the supply voltage level. Therefore, the method is popularly used in which the I/O lines 251 and 252 are brought to the intermediate potential such as $V_{cc}-V_T$ in the standby period.

The operation of the static RAM with the fluctuation of supply voltage will be hereinafter described with reference to FIGS. 2 and 4.

In the case shown in FIG. 4, in the standby period, namely, when the signal ext.$\overline{CS}$ is at a high level, the supply voltage changes from a high level value $V_{cc}(H)$ to a low level value $V_{cc}(L)$. Even after the supply voltage changed to the value of $V_{cc}(L)$, the I/O lines 251 and 252 are continuously brought to the high level voltage, that is, $V_{cc}(H)-V_T$.

When the signal ext.$\overline{CS}$ changes to the low level, namely, the active operation starts, and the memory cell signal is first read to the I/O lines 251 and 252, the sensitivity of the sense amplifier decreases to cause an access delay. More specifically, the supply voltage applied to the sense amplifier is provided with the reduced $V_{cc}(L)$ level voltage while the voltage of the I/O lines 251 and 252 will be the level changed from the $V_{cc}(H)$ level by the signal from the memory cell. Therefore, the sense amplifier operates being off the optimal range of operation, so that the sensitivity is reduced and it takes much time to read the data on the I/O lines 251 and 252. In addition, as is specifically shown by the dotted line in FIG. 4, it takes much time to stabilize the voltage level of the I/O line to which a low level signal is applied from the memory cell, and, as shown by the solid line in FIG. 4, the equalization comes to an end before the two I/O lines 251 and 252 attain the same voltage value. The foregoing also causes the access delay.

SUMMARY OF THE INVENTION

Therefore, an object of the present invention is to provide a semiconductor memory device which is capable of preventing an access delay due to the fluctuation of the supply voltage.

Another object of the present invention is to provide an improved semiconductor memory device which is capable of readily preventing the access delay.

A further object of the present invention is to provide a semiconductor memory device which is capable of high speed and reliable precharge operation of the I/O bus line.

A further object of the present invention is to provide a semiconductor memory device which is capable of high speed and reliable equalizing operation of the I/O bus line.

Briefly stated, the present invention comprises precharge means for precharging first and second I/O bus lines in response to an external state control signal, equalizing means for equalizing the first and second I/O bus lines in response to an equalizing signal which responds to a clock signal, and ground connection means for bringing the first and second I/O bus lines to the voltage of the ground level in response to the state control signal.

According to the present invention, the ground connection means brings the first and second I/O bus lines to the voltage of the ground level in response to the state control signal, and thereafter the first and second I/O bus lines are precharged by the precharge means. Therefore, the voltage applied to the I/O bus lines before the change of the state control signal does not remain on the I/O bus line, so that the access delay can be prevented which is derived from the fluctuation of the supply voltage before the change of the state control signal.

In a preferred embodiment, the ground connection means comprises first and second switching means connected between the first I/O bus line and the ground and between the second I/O bus line and the ground, respectively, and the first and second switching means operate in response to the state signal. Therefore, a ground connection means can be easily structured by simply adding two switching means.

In another preferred embodiment, the precharge means further comprises additional precharge signal generating means for generating an additional precharge signal in response to the state control signal, and additional precharge means for precharging the first and second I/O bus lines in response to the additional precharge signal. Since the first and second I/O bus lines are also precharged by the additional precharge means, high speed and reliable precharge operation can be implemented.

In a more preferred embodiment, the equalizing means further comprises additional equalizing signal generation means for generating an additional equalizing signal in response to the state control signal, and additional equalizing means for equalizing the first and second I/O bus lines in response to the additional equalizing signal. Since the first and second I/O lines are also equalized by the additional equalizing means, the high speed and reliable equalizing operation can be implemented.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
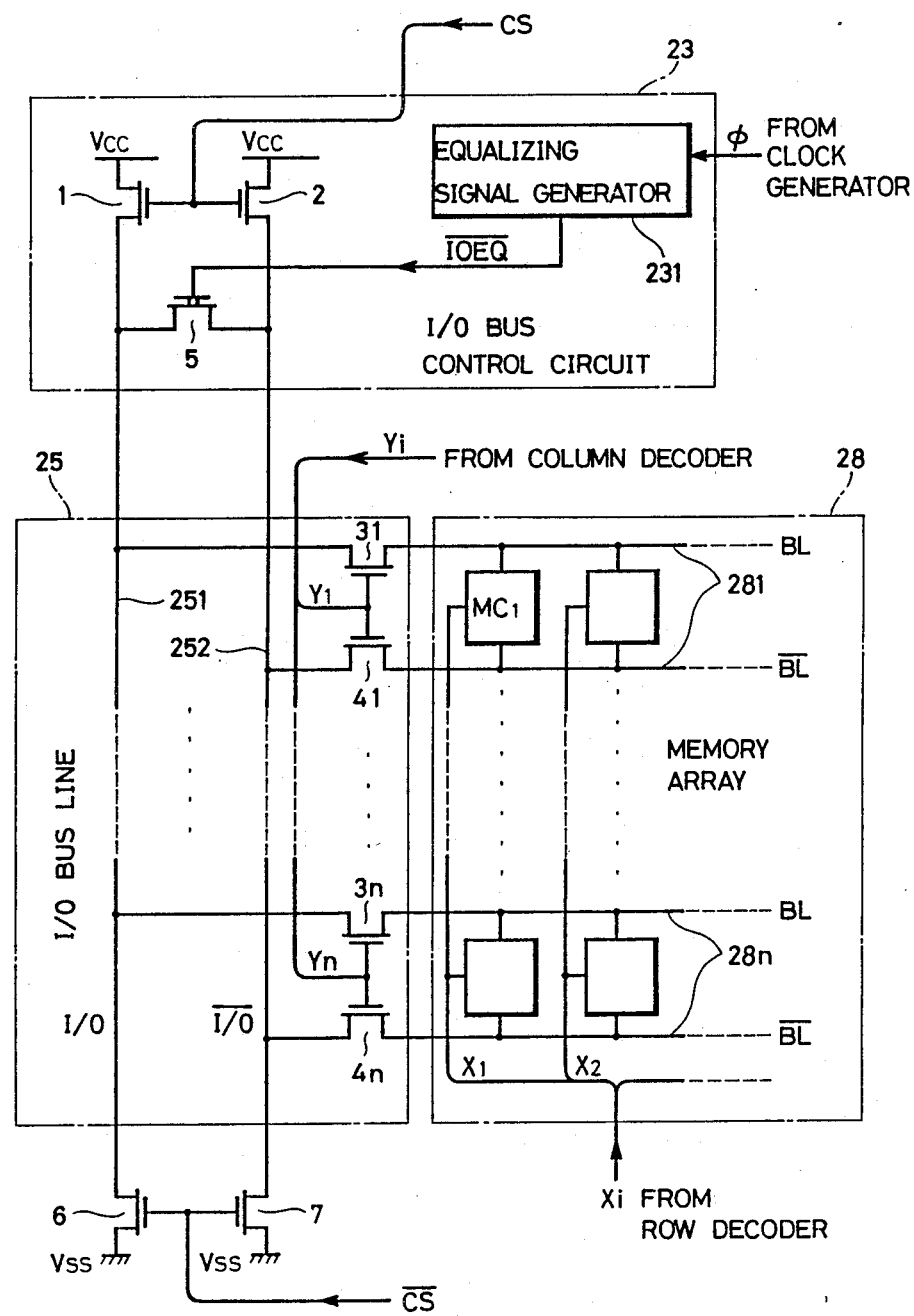
FIG. 5 is a schematic diagram showing an improved circuit for controlling the I/O bus line of one embodiment of the present invention.

FIG. 5 is a schematic diagram of an improved circuit for controlling the I/O bus lines of the static RAM, showing one embodiment of the present invention.

Figure 1:
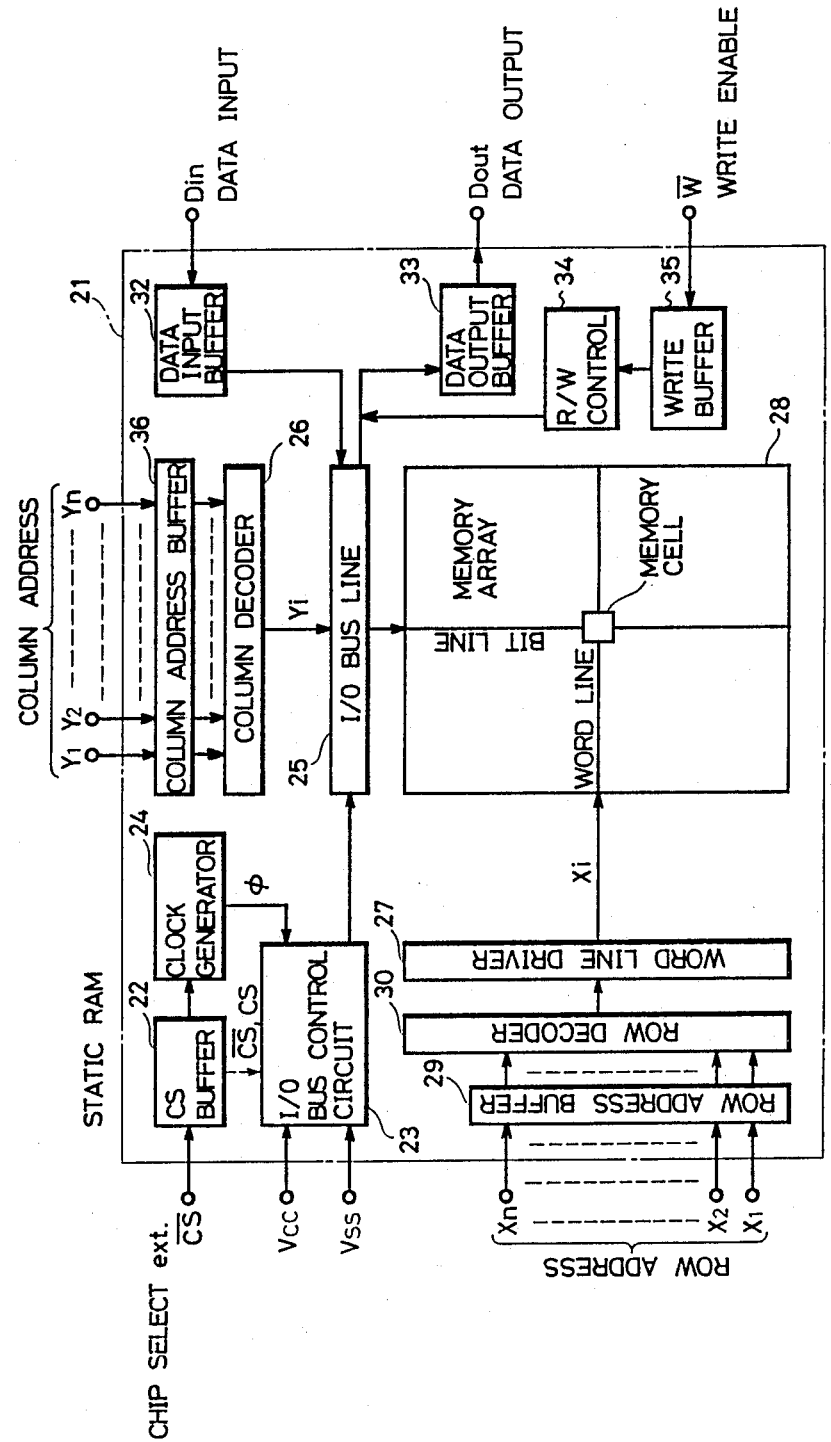
FIG. 1 is a block diagram showing a conventional static RAM.
Figure 2:
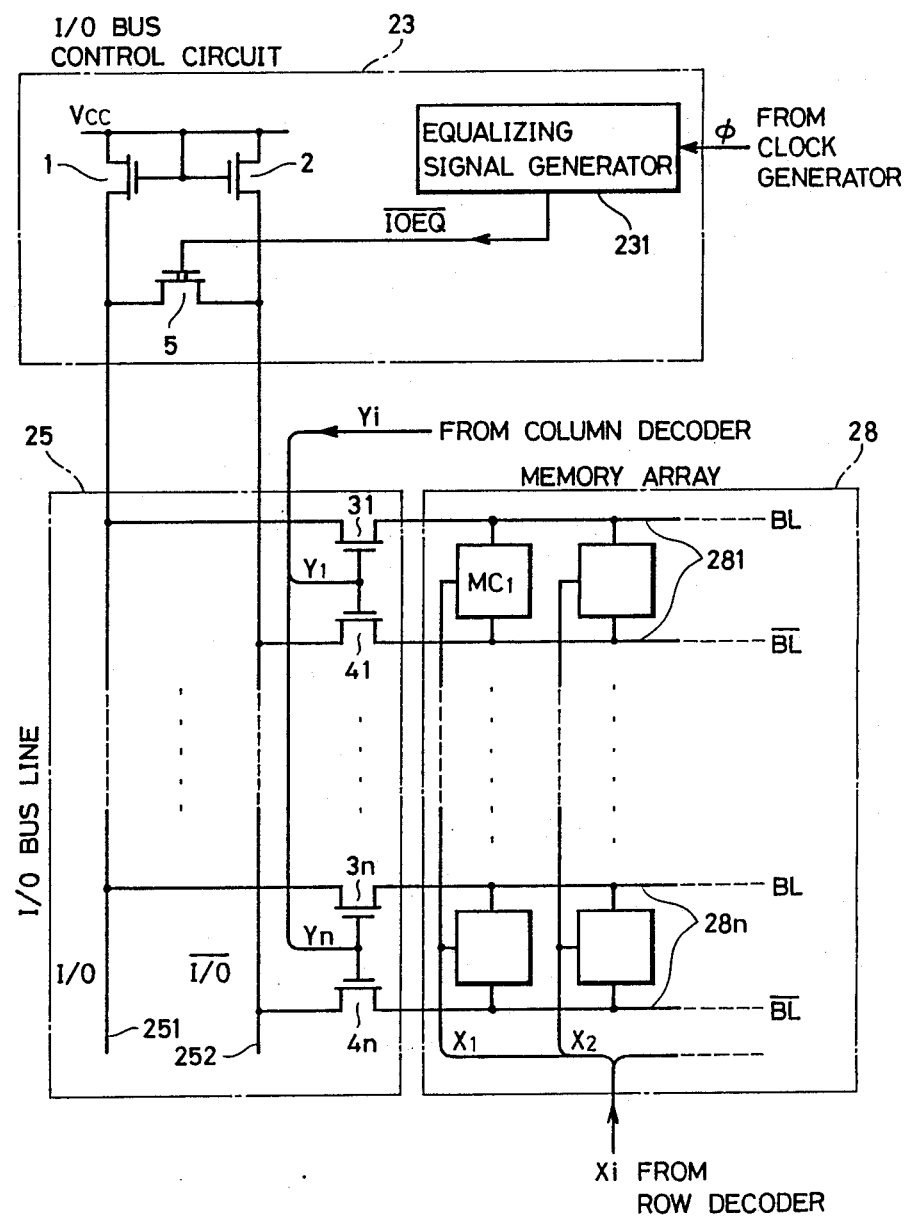
FIG. 2 is a schematic diagram showing a conventional I/O bus line control circuit for controlling the I/O bus line.

Referring to FIG. 5, compared with the conventional circuit shown in FIG. 2, this improved circuit comprises n channel field effect transistors 6 and 7 connected between the I/O lines 251 and 252 and the ground $V_{ss}$. The gates of the transistors 6 and 7 are connected together, to which a first chip select signal $\overline{CS}$ is applied. The transistors 1 and 2 connected between the power supply $V_{cc}$ and the I/O lines 251 and 252 have their gates connected together, to which a second chip select signal CS is applied. The first and second chip select signals $\overline{CS}$ and CS are the inversions to each other. Other circuit connections of FIG. 5 are the same as that of FIG. 2, so that the description thereof will be omitted.

Figure 6:
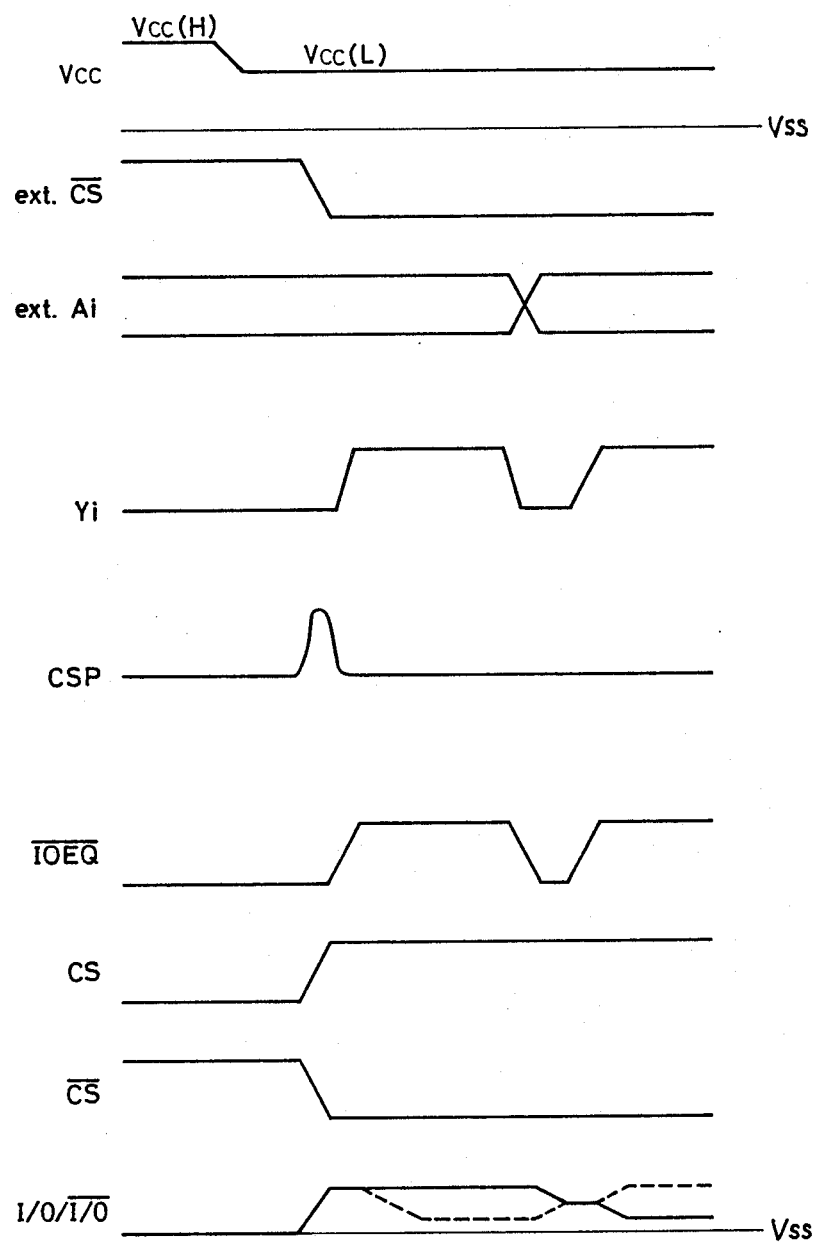
FIG. 6 is a timing chart for describing the operation of the circuit shown in FIG. 5.

FIG. 6 is a timing chart for describing the operation of the improved circuit shown in FIG. 5. FIG. 6 shows the change of each signal when the supply voltage fluctuates.

The operation of the circuit shown in FIG. 5 will be hereinafter described with reference to FIGS. 5 and 6.

First, the static RAM is in the standby state in response to a high level external chip elect signal ext.$\overline{CS}$. In the standby period, a high level first chip select signal $\overline{CS}$ is applied to the gates of the transistors 6 and 7 while a low level second chip select signal CS is applied to the gates of the transistors 1 and 2. Therefore, the I/O lines 251 and 252 are brought to the voltage of the ground $V_{ss}$ level. In the standby period, the supply voltage changes from $V_{cc}(H)$ to $V_{cc}(L)$ level.

Figure 3:
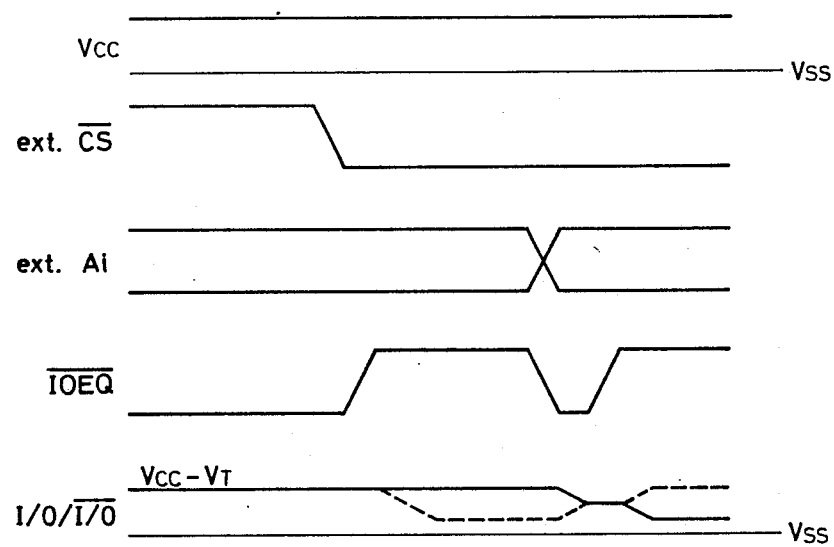
FIGS. 3 and 4 are both timing charts for describing the operation of the circuit of FIG. 2, with FIG. 3 showing the case in which the supply voltage has no fluctuation and FIG. 4 showing the case in which the supply voltage has fluctuation.
Figure 4:
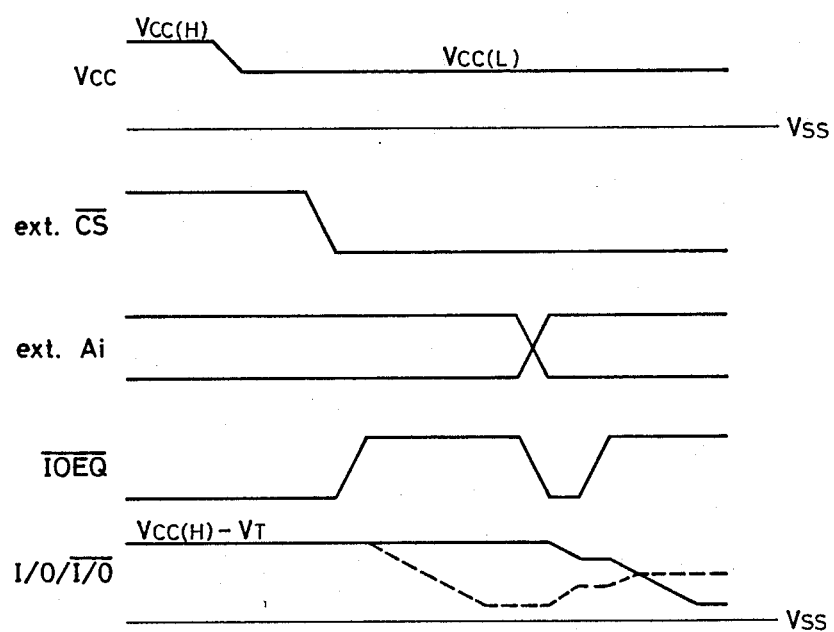

Thereafter, by the change of the signal ext.$\overline{CS}$ to the low level, the active operation starts. In the active period, the first chip select signal $\overline{CS}$ is at a low level and the second chip select signal CS is at a high level. Therefore, the I/O lines 251 and 252 are brought to the supply voltage level at that time, namely, $V_{cc}(L)$. Since a low level first equalizing signal $\overline{IOEQ}$ is applied to the gate of the transistor 5, the transistor 5 turns on and the equalization at this voltage level $V_{cc}(L)$ is carried out. After the first equalizing signal $\overline{IOEQ}$ changes to the high level, the operation of reading signals from the memory cells starts. The operation is similar to that described with reference to FIGS. 2 and 3 for the case in which there is no fluctuation in the supply voltage, so that the description thereof will be omitted. By applying the improved circuit of FIG. 5, the access delay due to the fluctuation of the supply voltage can be prevented.

In the foregoing, description is made of a case in which the supply voltage fluctuates in the standby period. When the supply voltage fluctuates in the active period, the following method is effective.

The precharge voltage of the I/O lines 251 and 252 are set equal to or less than $V_{cc}-V_T$. $V_{cc}$ denotes the supply voltage value and $V_T$ denotes the threshold voltage value of the transistors 31 to 3n and transistors 41 to 4n. The voltage on the bit lines 281 to 28n changes following the supply voltage. One I/O line out of the two I/O lines 251 and 252 which is brought to the high level by means of the signal from the memory cell follows the voltage of the bit line. Therefore, when the supply voltage changes in the active period, the high level voltage can be prevented from remaining on the I/O line.

Figure 7:
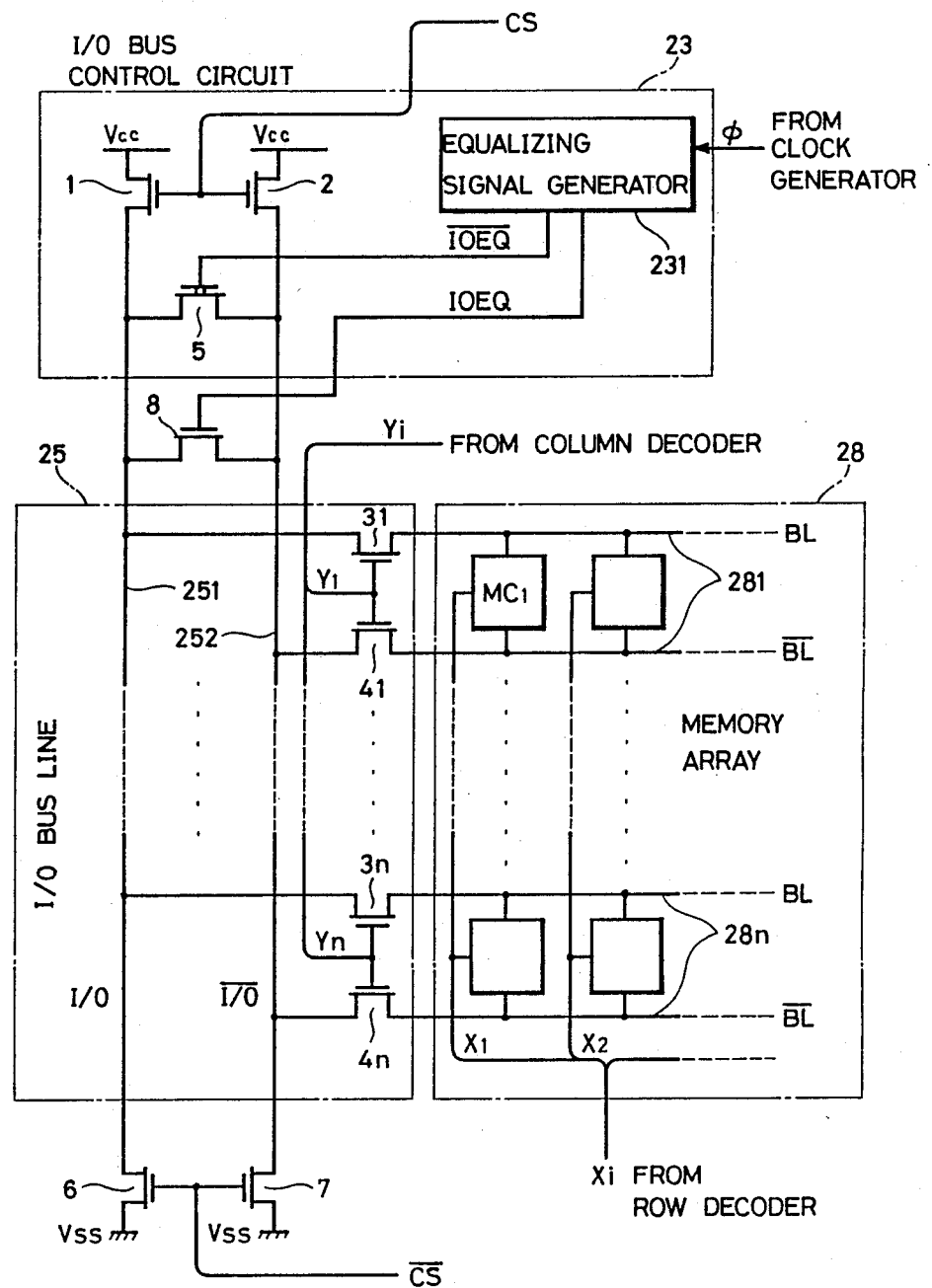
FIG. 7 is a schematic diagram showing an improved circuit for controlling the I/O bus line of another embodiment of the present invention.

FIG. 7 is a schematic diagram showing an improved circuit for controlling the I/O bus lines showing another embodiment of the present invention.

Referring to FIG. 7, compared with the circuit of FIG. 5, this improved circuit further comprises an n channel field effect transistor 8 connected between the I/O lines 251 and 252. A second equalizing signal IOEQ generated by an equalizing signal generator 231 is applied to the gate of the transistor 8. The first equalizing signal $\overline{IOEQ}$ and the second equalizing signal IOEQ are the inversions to each other. In operation, the two I/O lines 251 and 252 are both brought to the ground $V_{ss}$ level in the standby period, as is described with reference to FIGS. 5 and 6. Therefore, even if a low level first equalizing signal $\overline{IOEQ}$ is applied to the gate of the p channel field effect transistor 5, the transistor 5 is not turned on. Therefore, when the I/O lines 251 and 252 are at the ground $V_{ss}$ level, the transistor 5 is not effective for equalization. Meanwhile, since a high level second equalizing signal IOEQ is applied to the gate of the transistor 8 in the standby period, the transistor 8 is turned on. Therefore, even if the two I/O lines 251 and 252 are brought to the ground $V_{ss}$ level, the transistor 8 is effective in equalization. As described above, the improved circuit of FIG. 7 ensures the more reliable equalization in the precharge period.

Figure 8:
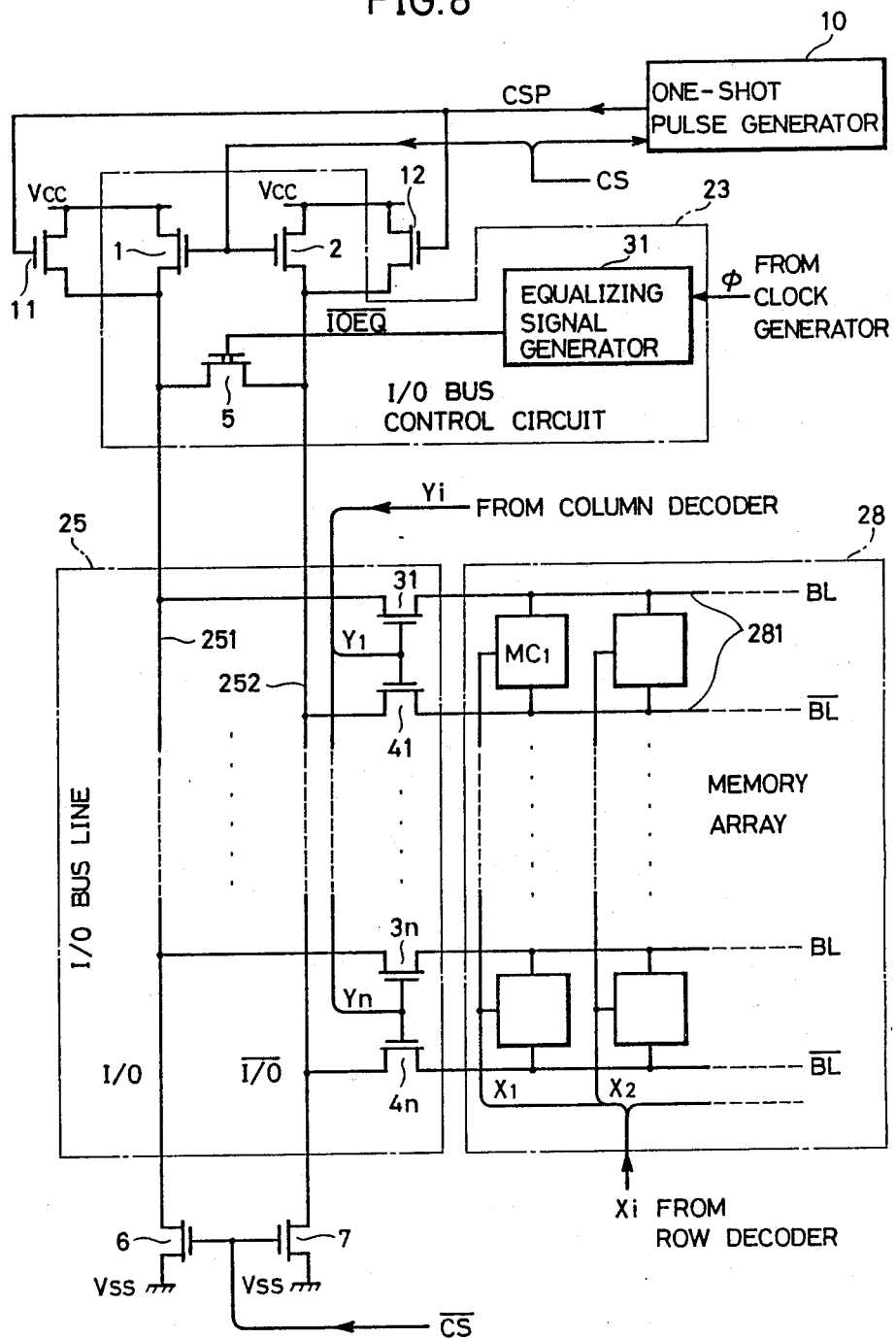
FIG. 8 is a schematic diagram showing an improved circuit for controlling the I/O bus line of a further embodiment of the present invention.

FIG. 8 is a schematic diagram showing an improved circuit for controlling the I/O bus lines showing a further embodiment of the present invention.

Referring to FIG. 8, compared with the circuit of FIG. 5, the improved circuit comprises n channel field effect transistors 11 and 12 respectively connected in parallel to the transistors 1 and 2 which are connected between the power supply $V_{cc}$ and the I/O lines 251 and 252, and a one shot pulse generator 10 for applying a one shot pulse CSP to the gates of the transistors 11 and 12. The transistors 11 and 12 are selected to have larger current drivability than the transistors 1 and 2.

In operation, the one shot pulse generator 10 generates a one shot pulse CSP in response to the second chip select signal CS as shown in the time chart of FIG. 6, wherein the pulse rises before the second chip select signal CS rises for the first time and falls before the column address signal Yi is applied. Therefore, at the start of the active period, both transistors 11 and 12 turn on only in the period of the pulse width of the one shot pulse CSP, thereby supplementing the precharge ability. In other words, precharging in a shorter time period becomes possible, enabling more stable reading operation.

Figure 9:
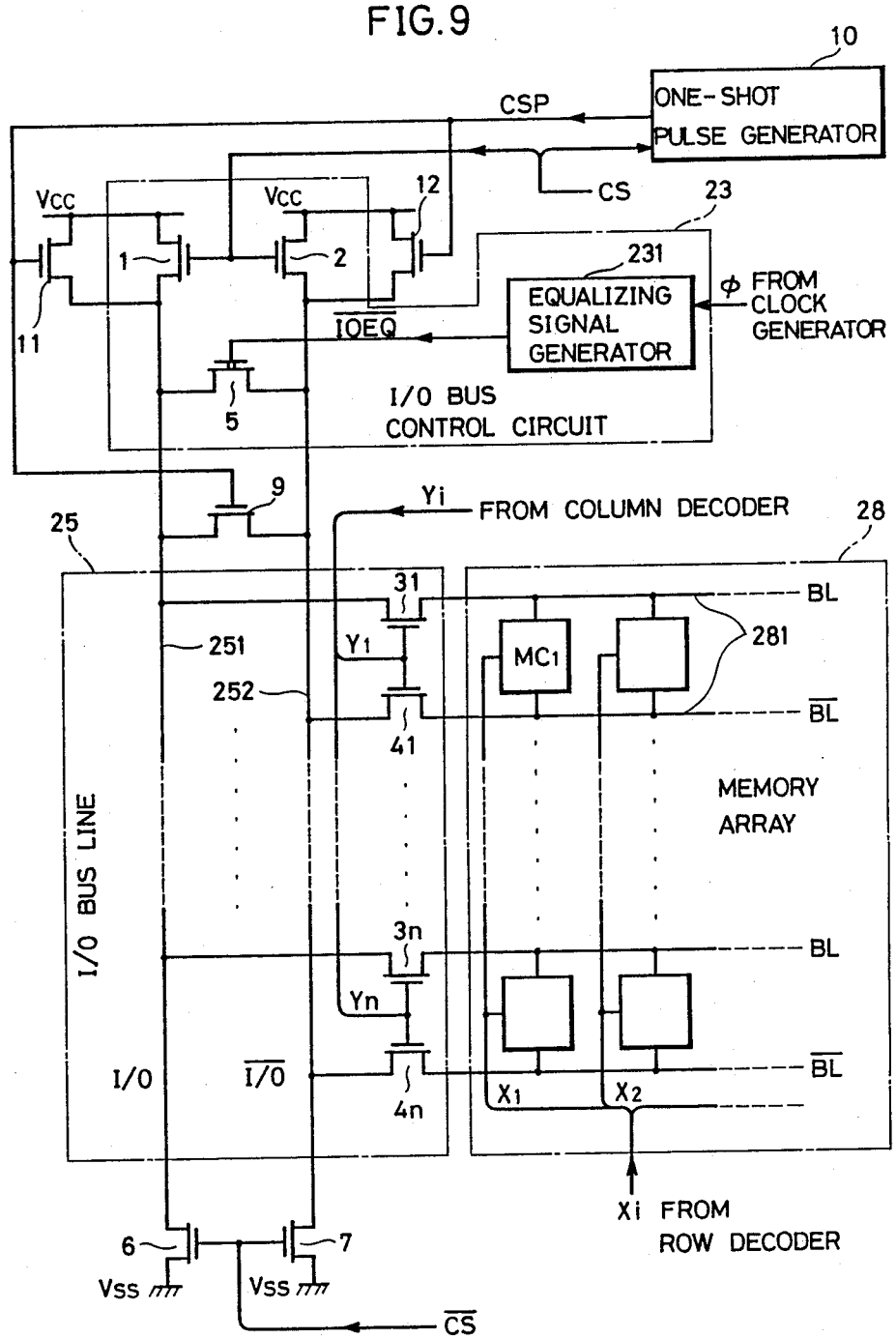
FIG. 9 is a schematic diagram showing an improved circuit for controlling the I/O bus line of still a further embodiment of the present invention.

FIG. 9 is a schematic diagram showing an improved circuit for controlling the I/O bus line, showing a still further embodiment of the present invention.

Referring to FIG. 9, compared with the circuit of FIG. 8, the improved circuit further comprises an n channel field effect transistor 9 connected between the two I/O lines 251 and 252. The gate of the transistor 9 is connected to receive the one shot pulse CSP from the one shot pulse generator 10.

In operation, the transistor 9 turns on only during the period of the pulse width in response to the one shot pulse CSP, so that the equalization can be more reliably carried out in precharging compared with the circuit of FIG. 8.

In the foregoing, although the description was made of a static RAM as an example of the semiconductor memory device, the present invention may be applied to the dynamic RAM. In that case, the chip select ($\overline{CS}$) signal corresponds to the row address strove ($\overline{RAS}$) signal.

As described above, the present invention comprises precharge means (1, 2) for precharging the first and second I/O bus lines (251, 252) in response to an external state control signal (ext.$\overline{CS}$), equalizing means (5, 8) for equalizing the first and second I/O lines (251, 252) in response to an equalizing signal ($\overline{IOEQ}$) which responds to the clock signal ($\phi$), and ground connection means (6, 7) for bringing the first and second I/O bus lines (251, 252) to the voltage of the ground ($V_{ss}$) level in response to the state control signal (ext.$\overline{CS}$). In operation, the first and second I/O bus lines (251, 252) are precharged by the precharge means (1, 2) after the ground connection means (6, 7) brought the first and second I/O bus lines (251, 252) to the voltage of the ground ($V_{ss}$) level in response to the state control signal (ext.$\overline{CS}$). Therefore, the voltage applied to the I/O bus lines (251, 252) before the change of the state control signal (ext.$\overline{CS}$) does not remain on the I/O bus lines, so that the access delay can be prevented which is caused by the fluctuation of the supply ($V_{cc}$) voltage before the change of the state control signal (ext.$\overline{CS}$).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
first and second I/O bus lines;
precharge means connected to a source of a first voltage potential and said first and second I/O bus lines for precharging said first and second I/O bus lines in response to a variable state signal;

equalizing signal generation means for generating an equalizing signal in response to a clock signal;

equalizing means connected between said first and second I/O bus lines for establishing an equipotential of said first and second I/O bus lines in response to said equalizing signal; and ground connection means connected to said first and second I/O bus lines for supplying a source of ground potential thereby bringing said first and second I/O bus lines to said ground level potential in response to said variable state control signal.

2. A semiconductor device according to claim 1, wherein said ground connection means comprises first ground switching means connected between said first I/O bus line and said ground level potential and second ground switching means connected between said second I/O bus line and said ground level potential, and wherein said first and second ground switching means operate in response to said variable state control signal to connect said respective first and second I/O bus lines to said source of ground level potential.

3. A semiconductor memory device according to claim 2, wherein said first and second switching means both comprise field effect devices of a certain conductivity type.

4. A semiconductor memory device according to claim 3, wherein said certain conductivity type comprises n type.

5. A semiconductor memory device according to claim 1, wherein said precharge means comprises:

first precharge switching means connected between said source of first voltage potential and said first I/O bus line, and second precharge switching means connected between said power supply and said second I/O bus line, and wherein said first and second precharge switching means operate in response to said variable state control signal to connect said first and second I/O bus lines, respectively, to said source of first voltage potential.

6. A semiconductor memory device according to claim 5, wherein said precharge means further comprises:

additional precharge signal generation means for generating an additional precharge signal in response to said variable state control signal; and additional precharge means connected between said source of first voltage potential and said first and second I/O bus lines for precharging said first and second I/O bus lines in response to said additional precharge signal.

7. A semiconductor memory device according to claim 6, wherein said additional precharge signal is a first one shot pulse signal, and wherein said additional precharge signal generation means comprises first one shot pulse signal generation means for generating said first one shot pulse signal in response to said state control signal.

8. A semiconductor memory device according to claim 6, wherein said additional precharge means comprises:

third precharge switching means connected between said source of first voltage potential and said first I/O bus line which operates in response to additional precharge signal to connect said first I/O bus line to said source of first voltage potential; and fourth precharge switching means connected between said source of first voltage potential and said second I/O bus lines which operates in response to said additional precharge signal to connect said second I/O bus line to said source of first voltage potential.

9. A semiconductor memory device according to claim 6, wherein said equalizing means further comprises an additional equalizing means connected between said first and second I/O bus lines for equalizing said first and second I/O bus lines in response to said additional precharge signal.

10. A semiconductor memory device according to claim 1, wherein said equalizing means comprises first equalizer switching means connected between said first and second I/O bus lines which operates in response to said equalizing signal.

11. A semiconductor memory device according to claim 10, wherein said equalizing means further comprises second equalizer switching means connected between said first and second I/O bus lines which operates in response to said equalizing signal.

12. A semiconductor memory device according to claim 10, wherein said equalizing means further comprises:

additional equalizing signal generation means for generating an additional equalizing signal in response to said variable state control signal; and additional equalizing means connected between said first and second I/O bus lines for equalizing said first and second I/O bus lines in response to said additional equalizing signal for establishing an equipotential of the bus lines.

13. A semiconductor memory device according to claim 12, wherein said additional equalizing means comprises second equalizer switching means connected between said first and second I/O bus lines which operates in response to said additional equalizing signal for establishing an equipotential of the bus lines.

14. A semiconductor memory device according to claim 12, wherein said additional equalizing signal is a second one shot pulse signal, and said additional equalizing signal generation means comprises second one shot pulse generation means for generating said second one shot pulse in response to said state control signal.

15. A semiconductor memory device according to claim 1, wherein said semiconductor memory device comprises a static random access memory device, and said state control signal comprises an external chip select signal.

16. A static random access memory device comprising a power supply;

ground;

first and second I/O bus lines;

precharge circuit connected between said power supply and said first and second I/O bus lines for precharging said first and second I/O bus lines in response to an externally applied external chip select signal;

equalize signal generation circuit for generating an equalizing signal in response to a clock signal;

equalizing circuit connected between said first and second I/O bus lines for equalizing said first and second I/O bus lines in response to said equalizing signal; and ground connection circuit connected between said first and second I/O bus lines and said ground for bringing said first and second I/O bus lines to the voltage of the ground level in response to said external chip select signal.

17. In a semiconductor memory including first and second I/O bus lines, a method for accessing a semiconductor memory device to minimize delays caused by supply voltage fluctuations comprising the steps of:

detecting a first state of a chip select signal;

applying a source of ground potential to said first and second I/O bus lines in response to detecting said first state of said chip select signal;

detecting a second state of said chip select signal;

applying a precharge voltage potential to said first and second I/O bus lines in response to detecting said second state of said chip select signal;

generating an equalizing signal in response to a clock signal;

establishing an electrical connection between said first and second I/O bus lines in response to said equalizing signal to create an equipotential of said bus lines.

* * * * *